(12) United States Patent
Free et al.

(10) Patent No.: US 7,175,876 B2
(45) Date of Patent: Feb. 13, 2007

(54) PATTERNED COATING METHOD EMPLOYING POLYMERIC COATINGS

(75) Inventors: M. Benton Free, St. Paul, MN (US); Mikhail L. Pekurovsky, Bloomington, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 190 days.

(21) Appl. No.: 10/607,698

(22) Filed: Jun. 27, 2003

(65) Prior Publication Data

US 2004/0265492 A1 Dec. 30, 2004

(51) Int. Cl.
*B05D 1/32* (2006.01)
*B05D 5/12* (2006.01)

(52) U.S. Cl. .................. 427/96.1; 427/97.1; 427/97.3; 427/118; 427/154; 427/272; 427/240; 427/446; 427/420; 427/430.1

(58) Field of Classification Search .................. 427/58, 427/96, 96.1, 97.1, 97.3, 78.4, 118, 154, 259, 427/261, 264, 272, 282, 240, 446, 420, 430.1
See application file for complete search history.

(56) References Cited

U.S. PATENT DOCUMENTS

| | | | |
|---|---|---|---|
| 2,532,011 A | 11/1950 | Dahlquist et al. | |
| 2,607,711 A | 8/1952 | Hendricks | |
| 3,318,852 A | 5/1967 | Dixon | |
| 3,502,497 A | 3/1970 | Crocker | |
| 3,532,540 A | 10/1970 | Pearson et al. | |
| 3,931,454 A | 1/1976 | Sprengling | |
| 3,935,334 A * | 1/1976 | Narui et al. ................... | 427/81 |
| 4,241,198 A | 12/1980 | Kobayashi | |
| 4,728,571 A | 3/1988 | Clemens et al. | |
| 5,032,460 A | 7/1991 | Kantner et al. | |
| 5,104,711 A | 4/1992 | Marsek | |
| 5,121,134 A | 6/1992 | Albinson et al. | |
| 5,145,717 A | 9/1992 | Drury | |
| 5,165,962 A | 11/1992 | Daly | |
| 5,202,190 A | 4/1993 | Kantner et al. | |
| 5,209,815 A * | 5/1993 | Fleming et al. ................ | 216/36 |
| 5,214,119 A | 5/1993 | Leir et al. | |
| 5,290,615 A | 3/1994 | Tushaus et al. | |
| 5,356,706 A | 10/1994 | Shores | |
| 5,468,324 A | 11/1995 | Hong | |

(Continued)

FOREIGN PATENT DOCUMENTS

DE 39 24 716 A1 2/1990

(Continued)

OTHER PUBLICATIONS

*Journal of Applied Polymer Science*, vol. 13, "Estimation of the Surface Free Engery of Polymers", D.K.Owens and R.C.Wendt, pp. 1741-1747, 1969.

*Primary Examiner*—Fred J. Parker
(74) *Attorney, Agent, or Firm*—Pamela L. Stewart

(57) ABSTRACT

Patterned articles can be prepared by applying a release polymer to a substrate in a desired pattern, applying a substrate-adherent polymer over the pattern and substrate, and mechanically removing the substrate-adherent polymer from the pattern without requiring solvent. Suitable mechanical removal methods include applying adhesive tape to the substrate-adherent polymer and peeling the tape and substrate-adherent polymer away from the pattern, and abrading the substrate-adherent polymer from the pattern using impact media.

28 Claims, 4 Drawing Sheets

U.S. PATENT DOCUMENTS

| | | |
|---|---|---|
| 5,658,469 A | 8/1997 | Jennison |
| 5,750,630 A | 5/1998 | Sengupta |
| 5,759,625 A * | 6/1998 | Laubacher et al. ......... 427/264 |
| 5,866,195 A * | 2/1999 | Lemelson ................... 427/62 |
| 6,300,042 B1 | 10/2001 | Mancini et al. |
| 6,329,227 B2 | 12/2001 | Anda et al. |
| 6,352,758 B1 | 3/2002 | Huang et al. |
| 6,498,114 B1 | 12/2002 | Amundson et al. |
| 6,559,474 B1 | 5/2003 | Craighead et al. |
| 2003/0203101 A1 * | 10/2003 | Haubrich et al. ............. 427/96 |

FOREIGN PATENT DOCUMENTS

EP      0 395 411     * 10/1990

* cited by examiner

PATTERNED COATING METHOD EMPLOYING POLYMERIC COATINGS

FIELD OF THE INVENTION

This invention relates to methods for forming patterned coatings.

BACKGROUND

In many applications, especially those involving electronics, patterned coatings must be formed in one or more layers on a substrate. Available pattern formation methods include masking the substrate with tape and photoimaging. In masking, a tape is applied in a pattern over parts of the substrate. After coating the substrate using any convenient method (e.g., spin coating) and drying or curing the coating, the tape can be manually removed, leaving the patterned coating. However, coating build-up or edge distortion sometimes occurs near the pattern boundaries, and applying and removing the tape can be tedious. In photoimaging, a photocurable polymer is applied to the substrate, imaged in a pattern (using, for example a partially transparent and partially occluded mask and UV or shorter wavelength light), then removed from the unimaged areas (in a step sometimes called "lift-off") using a suitable solvent. The choice of suitable photoimaging resins may be somewhat limited because many removal solvents may adversely affect the photocured polymer coating. The removal solvent may also pose environmental and other hazards.

References describing patterned coating or printed circuit formation include U.S. Pat. Nos. 3,931,454, 5,121,134, 5,145,717 5,165,962, 5,658,469, 5,759,625, 6,300,042 B1, 6,329,227 B2, 6,498,114 B1 and 6,559,474 B1. U.S. Pat. No. 5,468,324 describes a method for data recording duplication and microstructure fabrication. U.S. Pat. No. 6,352,758 B1 describes a patterned article. References involving masking include U.S. Pat. Nos. 5,104,711 and 5,165,962.

SUMMARY OF THE INVENTION

The present invention provides, in one aspect, a method for preparing a patterned article comprising:
  a) applying a release polymer to a portion of a substrate in a desired pattern;
  b) applying a substrate-adherent polymer over the pattern and over at least a portion of the substrate in a continuous layer having a substantially constant height with respect to the substrate; and
  c) mechanically removing the substrate-adherent polymer from the pattern.

The invention provides, in another aspect, a method for preparing a patterned article comprising:
  a) applying a release polymer to a portion of a substrate in a desired pattern;
  b) applying a continuous layer of a substrate-adherent polymer over the pattern and over at least a portion of the substrate;
  c) applying an adhesive tape to the substrate-adherent polymer; and
  d) removing the adhesive tape and substrate-adherent polymer adhered to the tape while leaving a portion of the substrate-adherent polymer adhered to the substrate in a negative of the pattern.

The invention provides, in a further aspect, a method for preparing a patterned article comprising:
  a) applying a submicron-thickness release polymer layer to a portion of a substrate in a desired pattern;
  b) applying a continuous submicron-thickness polyimide layer over the pattern and over at least a portion of the substrate; and
  c) removing a portion of the polyimide layer from the release polymer while leaving the remainder of the polyimide layer adhered to the substrate in a negative of the pattern.

DETAILED DESCRIPTION

By using the term "polymer" we refer to homopolymers and copolymers, as well as to homopolymers or copolymers that may be formed in a miscible blend, e.g., by coextrusion or by reaction, including, e.g., transesterification. The term "copolymer" includes both random and block copolymers.

By using the term "film former" we refer to a material that can be coated in a thin film (e.g., about of about 0.05 mm) on a suitable substrate to form a substantially continuous coating.

By using words of orientation such as "atop", "on", "uppermost" and the like for the location of various elements in an article, we refer to the relative position of the element with respect to a horizontal support or reference plane. We do not intend that such elements or articles should have any particular orientation in space during or after their manufacture.

By using the term "overcoated" to describe the position of a layer with respect to a substrate or other element (e.g., an underlying layer) in an article, we refer to the recited overcoated layer as being atop the substrate or other element, but not necessarily contiguous to the substrate or other element. By using the term "separated by" to describe the position of a first element with respect to two other elements, we refer to the first element as being between the other elements but not necessarily contiguous to either other element.

By using the term "surface energy" with respect to a polymer, we refer to the measured surface energy of a thin film of the polymer determined using a contact angle goniometer and two test liquids as described in D. K. Owens and R. C. Wendt, *J. Appl Polym. Sci.* 13, 1741 (1969).

By using the term "mechanically removing" with respect to a polymer layer, we refer to removal methods that rely on adhesion to, abrasion of or physical impact (including impact from a jet of air, water or a solution containing water)

upon the polymer layer and that do not require (but can if desired be augmented by) the application of an organic solvent to the polymer layer.

Figure 1:
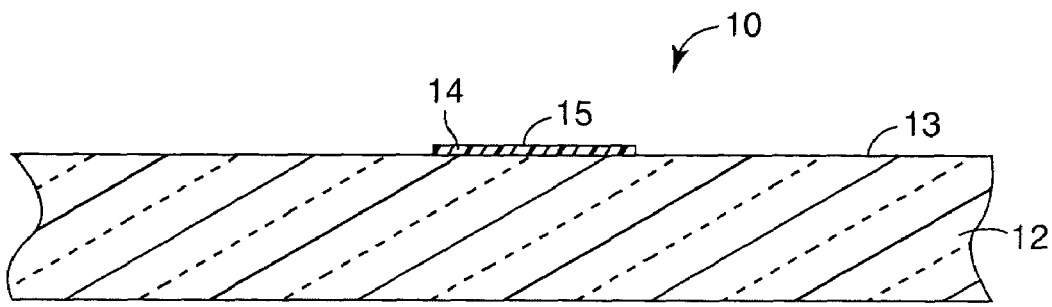
FIG. 1 is a cross-sectional view of a substrate partially coated with a release polymer.

Referring to FIG.1, patterned article 10 has glass substrate 12 overcoated on a portion of its upper surface 13 with release polymer 14. Release polymer 14 forms a pattern (shown in cross-section in FIG. 1) on upper surface 13 representing, for example, circuit traces, electrical connections, electrodes or the like. The upper surface 15 of release polymer 14 preferably has a lower surface energy than upper surface 13.

Figure 2:
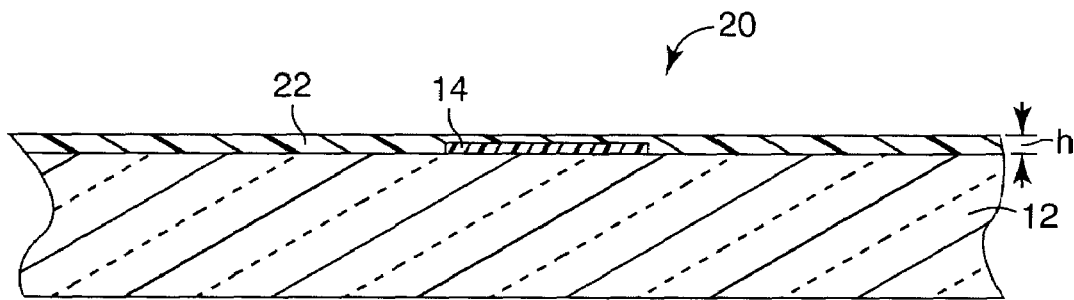
FIG. 2 is a cross-sectional view of the article of FIG. 1 overcoated with a substrate-adherent polymer.

FIG. 2 illustrates an intermediate article 20 made by applying substrate-adherent polymer 22 atop patterned article 10. Substrate-adherent polymer 22 forms a continuous layer atop release polymer 14 having a substantially constant height h with respect to substrate 12. Release polymer 14 preferably has a sufficiently low surface energy so that substrate-adherent polymer 22 forms at best a weak bond to release polymer 14 that can readily be debonded using mechanical measures described in more detail below. Substrate-adherent polymer 22 has greater adhesion to substrate 12 than to release polymer 14.

Figure 3:
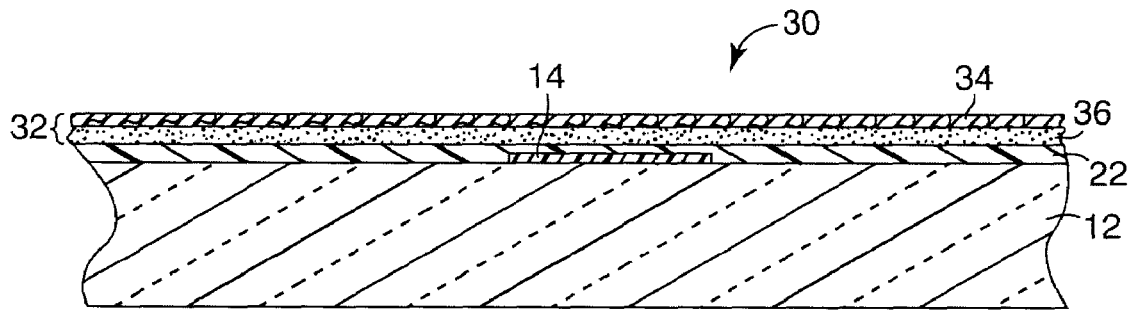
FIG. 3 is a cross-sectional view of the article of FIG. 2 covered with an adhesive tape.

FIG. 3 illustrates an intermediate article 30 made by attaching adhesive tape 32 atop article 20. Adhesive tape 32 has backing 34 and adhesive layer 36. Substrate-adherent polymer 22 has greater adhesion to adhesive layer 36 than to release polymer 14, but has lower adhesion to adhesive layer 36 than to substrate 12.

Figure 4:
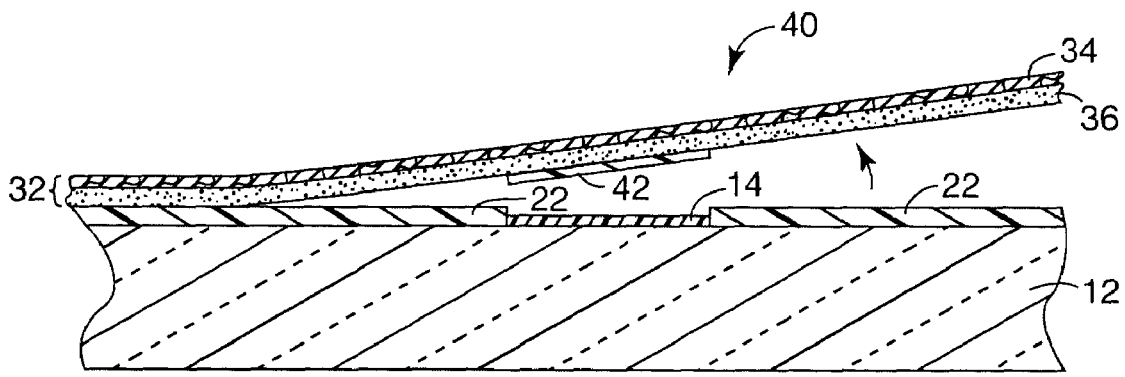
FIG. 4 is a cross-sectional view of the article of FIG. 3 as the adhesive tape is being peeled away.

FIG. 4 illustrates one method for mechanically removing substrate-adherent polymer 22 from the pattern atop substrate 12. As shown by the arrow in FIG. 4, tape 32 can be peeled away from substrate 12 to remove substrate-adherent polymer 42 adhered to tape 32 while leaving substrate-adherent polymer 22 adhered to substrate 12 in a negative of the pattern or "pattern negative". This step provides patterned article 40 whose upper surface is covered with a pattern formed by regions covered with release polymer 14 and a pattern negative formed by regions covered with substrate-adherent polymer 22.

Figure 5:
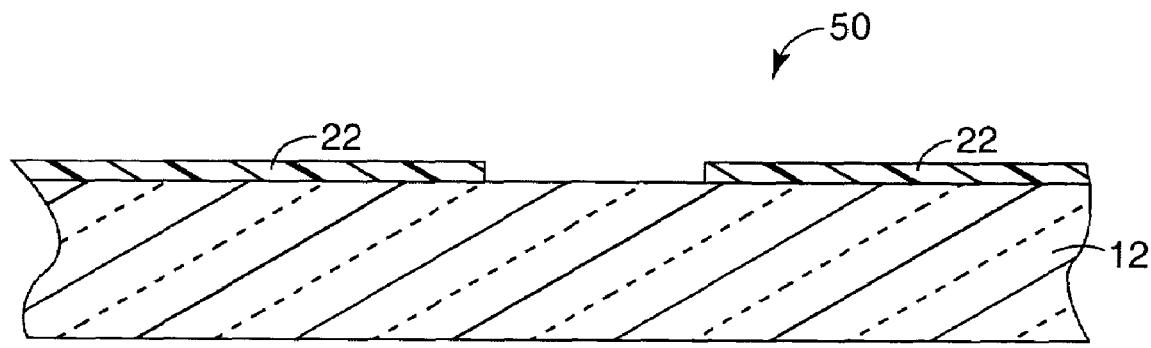
FIG. 5 is a cross-sectional view of the article of FIG. 3 after the adhesive tape has been peeled away and the release polymer has been removed.

FIG. 5 illustrates a patterned article 50 that can be made by washing away release polymer 14 using a suitable solvent. This washing step is optional and will not be needed or desired in all applications. The upper surface of article 50 has a pattern formed by exposed, uncovered regions (formerly covered by release polymer 14) and a pattern negative formed by regions covered with substrate-adherent polymer 22.

Figure 6:
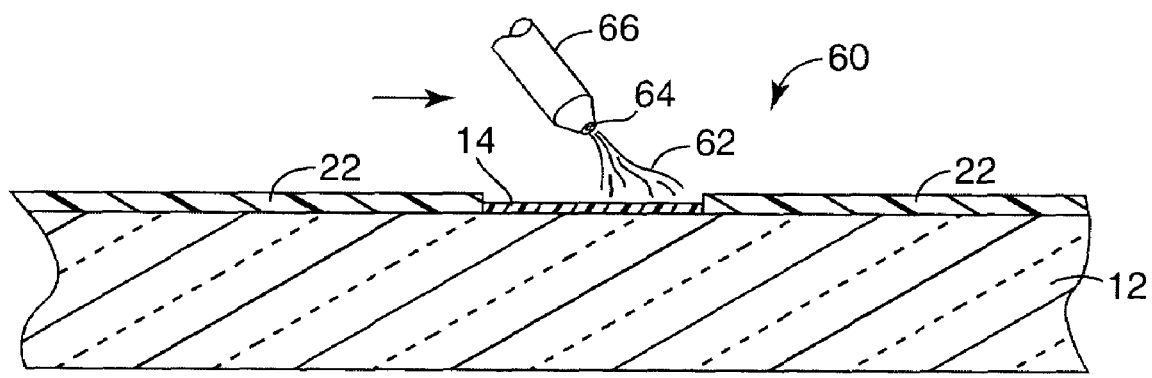
FIG. 6 is a cross-sectional view of an impact media technique for mechanically removing a portion of the substrate-adherent polymer from the release polymer.

FIG. 6 illustrates another method for mechanically removing substrate-adherent polymer 22 from the pattern atop substrate 12. This method can be carried out using article 20 shown in FIG. 2. Impact media 62 propelled through orifice 64 in impact abrading device 66 abrade away the portion of substrate-adherent polymer 22 atop release polymer 14. If desired, further application of impact media 62 can be used to abrade away release polymer 14 as well.

A variety of substrates can be employed in the invention. Suitable substrates include but are not limited to inorganic substrates such as quartz, glass, silica and other oxides or ceramics such as alumina, indium tin oxide, lithium tantalate ($LiTaO_3$), lithium niobate ($LiNbO_3$), gallium arsenide (GaAs), silicon carbide (SiC), langasite (LGS), zinc oxide (ZnO), aluminum nitride (AlN), silicon (Si), silicon nitride ($Si_3N_4$), and lead zirconium titanate ("PZT"); metals or alloys such as aluminum, copper, gold, silver and steel; thermoplastics such as polyesters (e.g., polyethylene terephthalate or polyethylene naphthalates), polyacrylates (e.g., polymethyl methacrylate or "PMMA"), poly(vinyl acetate) ("PVAC"), poly(vinylbutyral) ("PVB)", poly(ethyl acrylate) ("PEA"), poly(diphenoxyphosphazene) ("PDPP"), polycarbonate ("PC"), polypropylene ("PP"), high density polyethylene ("HDPE"), low density polyethylene ("LDPE"), polysulfone ("PS"), polyether sulfone ("PES"), polyurethane ("PUR"), polyamide ("PA"), polyvinyl chloride ("PVC"), polyvinylidene fluoride ("PVdF"), polystyrene and polyethylene sulfide; and thermoset plastics such as cellulose derivatives, polyimide, polyimide benzoxazole and polybenzoxazole. Preferably care is taken when selecting the substrate so that there will be an adequate degree of adhesion between the substrate and the substrate-adherent polymer. If desired, the substrate can be washed with a suitable solvent to enhance adhesion of the release polymer or substrate-adherent polymer or both. The substrate can instead or in addition to be pretreated to enhance such adhesion. Preferred pretreatments include but are not limited to electrical discharge in the presence of a suitable reactive or non-reactive atmosphere (e.g., plasma, glow discharge, corona discharge, dielectric barrier discharge or atmospheric pressure discharge); chemical pretreatment (e.g., with a low solids solution of polyvinylidene dichloride or with a solvent-borne mixture of a polyester resin and an aziridine crosslinker); flame pretreatment; ultraviolet light pretreatment with or without ozone pretreatment; and incorporating functional polymers into the substrate when a polymeric substrate is employed.

A variety of release polymers can be employed. Preferred release polymers include but are not limited to silicone polymers, fluorochemical polymers and polymers containing long alkyl side chains. Suitable silicone polymers include silicone polyurethanes, silicone polyureas, silicone polyurethane/ureas and silicone acrylate grafted copolymers such as those described in U.S. Pat. Nos. 4,728,571, 5,032, 460, 5,202,190, 5,214,119, 5,290,615, 5,356,706 and 5,750, 630. Suitable fluorochemical-containing polymers include those described in U.S. Pat. No. 3,318,852. Suitable polymers containing long alkyl side chains include polyvinyl N-alkyl carbamates such as polyvinyl N-octadecyl carbamates, and copolymers containing higher alkyl acrylates or methacrylates such as octadecyl acrylate, stearyl methacrylate or behenyl acrylate, e.g., those described in U.S. Pat. Nos. 2,532,011, 2,607,711, 3,502,497 and 4,241,198. In polymers containing long alkyl side chains, the side chain preferably includes from about 16 to 22 carbon atoms. The release polymer can include additives such as fillers, pigments, wetting agents, viscosity modifiers, stabilizers, antioxidants or cross-linking agents. The release polymer can be formed in situ, or applied as a preformed polymer carried in a suitable solvent. The release polymer can be crosslinked if desired. As noted above, the release polymer preferably has a sufficiently low surface energy so that the substrate-adherent polymer forms at best a weak bond to the release polymer. This does not require that the release polymer have a lower surface energy than the substrate-adherent polymer. A variety of factors other than surface energy may govern the degree of adhesion between the release polymer and the substrate-adherent polymer, including the respective chemical compositions of the release polymer and substrate-adherent polymer and their respective surface topologies. Preferably however the release polymer has a surface energy less than that of the substrate-adherent polymer. The release polymer preferably is a film former that can be applied to form a coating that when dried or cured will have a thickness below about 3 μm, more preferably below about 2 μm, and for some applications a preferred submicron thickness. A variety of coating techniques can be employed to apply the release polymer, including swabbing, dip coating, roll coating, spin coating, spray coating, die coating, ink jet coating, screen printing (e.g., rotary screen printing), gravure printing and flexographic printing. If the release polymer is formed in situ, a variety of techniques can be employed to form the release polymer including exposure to heat, UV, electron beam or laser energy; two-part chemical cure systems; one part chemical cure systems that are prevented from premature cure by the use of a suitable blocking agent or encapsulants; and other techniques that will be familiar to those skilled in the art.

A variety of substrate-adherent polymers can be employed. Preferred substrate-adherent polymers include but are not limited to PMMA, PVAC, PVB, PEA, PDPP, fluoropolymers, epoxies, polyhexamethyldisiloxane ("HMDSO"), polyimides and polystyrene. The substrate-adherent polymer can include additives such as fillers, pigments, wetting agents, viscosity modifiers, stabilizers, anti-oxidants or cross-linking agents. The substrate-adherent polymer can be formed in situ, or applied as a preformed polymer carried in a suitable solvent. The substrate-adherent polymer can be crosslinked if desired. Preferably the substrate-adherent polymer has a surface energy greater than that of the release polymer. As a general guide, the substrate-adherent polymer preferably also has a surface energy greater than that of the substrate. If desired, the substrate-adherent polymer can include various adjuvants such as small particle fillers, surface active agents, UV absorbers, photoinitiators, colorants and indicators. The substrate-adherent polymer preferably is applied at a thickness greater than that of the release polymer but not so great as to make it difficult to remove the substrate-adherent polymer from the pattern. As a general guide, the substrate-adherent polymer thickness preferably is about 2 to about 10 times the release polymer thickness, and more preferably about 3 to about 7 times the release polymer thickness. As a further general guide, the substrate-adherent polymer preferably is a film former that can be applied to form a coating that when dried or cured will have a thickness with respect to the substrate of about 3 µm to about 15 µm, more preferably about 3 to about 10 µm, and most preferably about 3 to about 5 µm.

The substrate-adherent polymer is applied in a continuous layer over the pattern. This preferably provides a smooth, continuous substrate-adherent polymer coating having a substantially constant height with respect to the substrate. If the substrate-adherent polymer coating is not sufficiently thick to cover the release polymer pattern then it will not provide a continuous layer over the release polymer pattern having a substantially constant height with respect to the substrate and the eventual edges or margins of the pattern negative may be uneven or otherwise inadequately defined, or the pattern may exhibit edge artifacts.

A variety of coating techniques can be employed to apply the substrate-adherent polymer including those mentioned above with respect to the release polymer. If the substrate-adherent polymer is formed in situ, a variety of polymerization techniques can be employed including those mentioned above with respect to the release polymer.

The substrate-adherent polymer can be removed from the pattern using a variety of mechanical methods. Suitable mechanical removal methods include but are not limited to the use of adhesive tape or impact media as described above, as well as the use of low impact or high impact coating dislodgment aids such as sandpaper, buffing pads, pressurized air and ultrasonic horns. Mechanical removal may facilitate the formation of a pattern having sharply defined edges. Following removal of the substrate-adherent polymer, the release polymer can be left atop the substrate or if desired can also be removed, thereby exposing a portion of the substrate. A variety of removal techniques can be employed, including but not limited to the use of solvents or impact media as described above, as well as the use of other coating dislodgement aids such as those just described for removal of the substrate-adherent polymer. When a solvent is employed, the solvent selection will depend in part upon the chosen release polymer. For fluoropolymers, hydrofluoroethers are particularly preferred removal solvents.

The invention can be used to make a variety of patterned articles including printed circuit boards, electrical connectors, information displays, electronic components, passivation layers and dielectric layers.

The invention is further illustrated in the following illustrative examples, in which all parts and percentages are by weight unless otherwise indicated.

EXAMPLE 1

Figure 7:
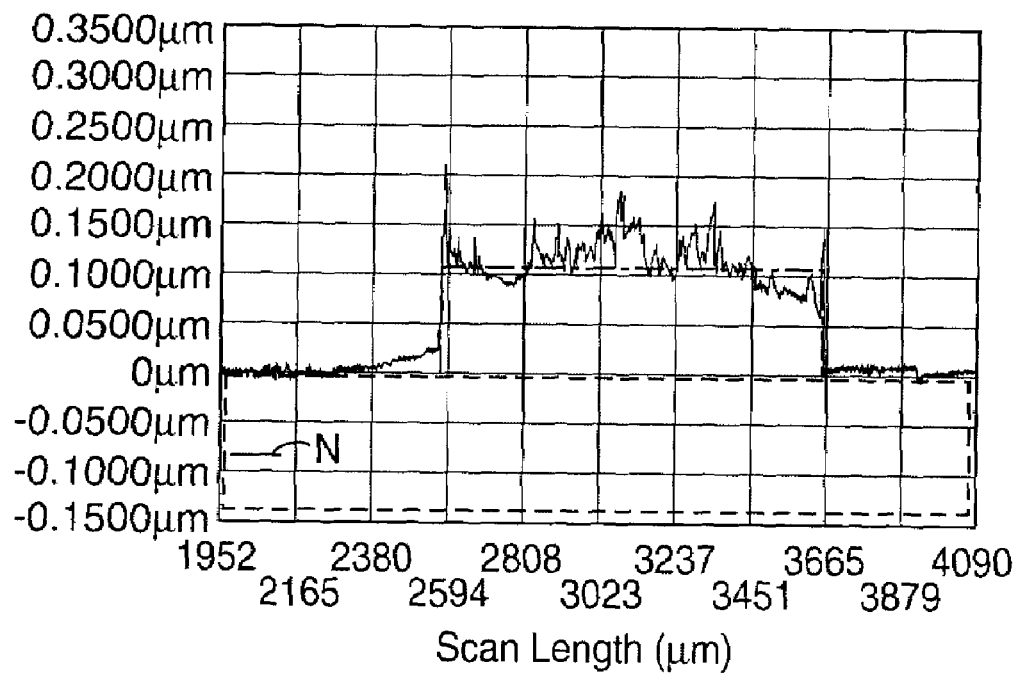
FIG. 7 through FIG. 11 are profilometer graphs.

Using a hand-held cotton swab, generally C-shaped and generally straight streaks of FLUORAD™ FC-722 fluoroaliphatic copolymer coating (formerly commercially available from Dyneon LLC Oakdale, Minn.) were formed on the surface of a 50 mm×75 glass slide. A rapid application rate was employed in order to obtain a release polymer coating thickness of about 0.1 µm as measured using a TENCOR™ profilometer (commercially available from KLA-Tencor Corporation, San Jose, Calif.). FIG. 7 shows the profilometer scan. In cross-section the release polymer coating looked like coating 14 in FIG. 1.

Figure 8:
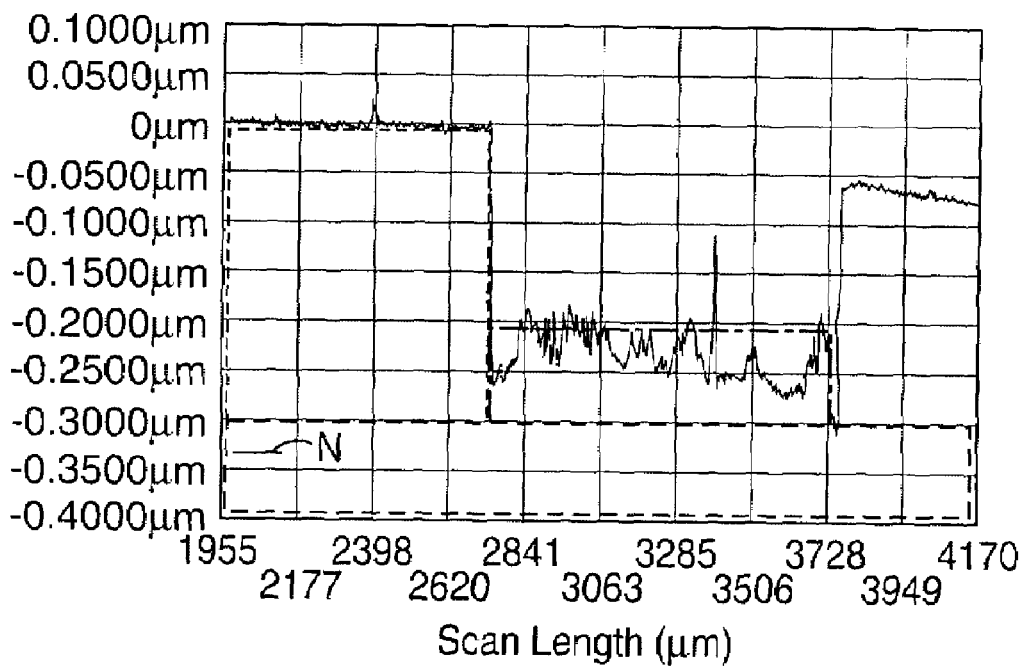

Using a spin-coating apparatus operated at 6000 rpm, No. PI 2579B polyimide (commercially available from HD Microsystems LLC, Parlin, N.J.) was coated over the pattern and over the remainder of the substrate to form a substrate-adherent polymer coating having a substantially constant height of about 0.3 µm with respect to the substrate. In cross-section the resulting article looked like article 20 in FIG. 2. A piece of Scotch Transparent Tape 600 (commercially available from 3M Company, St. Paul, Minn.) was placed atop the polyimide coating over the pattern and pressed into place to form an article which in cross-section looked like article 30 in FIG. 3. The tape was peeled away from the substrate as shown in FIG. 4, thereby removing the substrate-adherent polymer from atop the release polymer pattern and forming a patterned article which in cross-section looked like article 40 in FIG. 4. FIG. 8 shows a profilometer scan of the patterned article. As shown in FIG. 8, the edges of the pattern negative were sharply defined with the major exposed portion of each sidewall being generally perpendicular to the substrate, and both the release polymer nominal coating thickness and the substrate-adherent polymer nominal coating thickness were generally unchanged near the boundary between the release polymer and substrate-adherent polymer.

Figure 9:
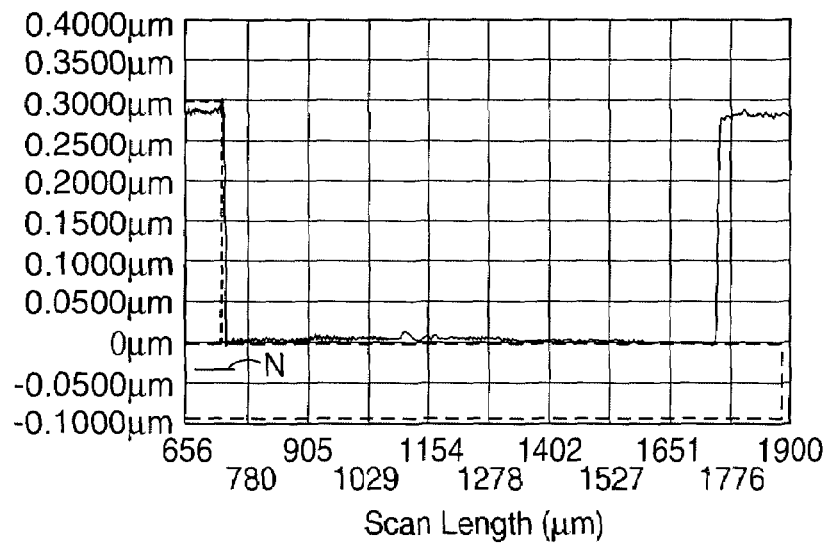

The fluoropolymer layer was removed from the patterned article by rinsing with NOVEC™ Engineered Fluid HFE-7200 hydrofluoroether (commercially available from 3M Company, St. Paul, Minn.) to form a patterned article which in cross-section looked like article 50 in FIG. 5. FIG. 9 shows a profilometer scan of the patterned article. The edges of the pattern negative remained sharply defined with the major exposed portion of each sidewall remaining generally perpendicular to the substrate.

EXAMPLE 2

Figure 10:
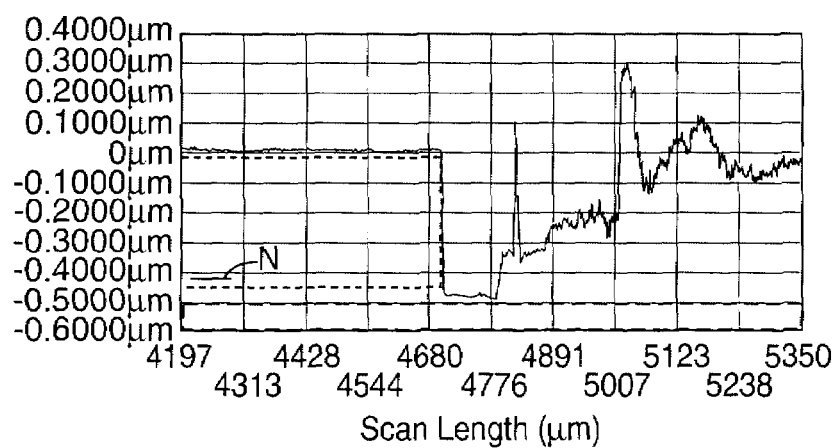
Figure 11:
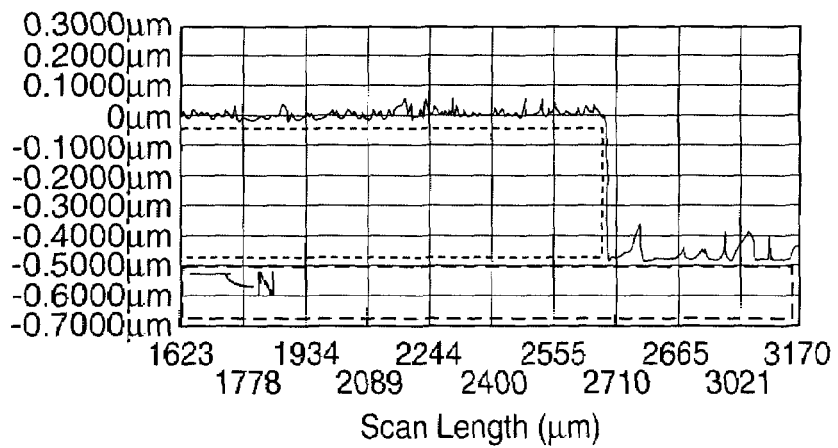

Using the general method of Example 1, a fluoropolymer release polymer pattern was formed on a glass slide. The release polymer was overcoated with a solvent-based ink applied by dip coating to form a 0.5 µm thick substrate-adherent polymer coating. A portion of the substrate-adherent polymer was removed using tape, and the underlying release polymer was removed using HFE-7200 hydrofluoroether. FIG. 10 and FIG. 11 show profilometer scans of the patterned article before and after removal of the release polymer. As shown in FIG. 10 and FIG. 11, the substrate-adherent polymer edges were sharply defined with the major exposed portion of each sidewall being generally perpendicular to the substrate.

Various modifications and alterations of this invention will be apparent to those skilled in the art without departing from the scope and spirit of this invention. This invention should not be restricted to that which has been set forth herein only for illustrative purposes.

We claim:

1. A method for preparing a patterned article comprising:
   a) applying a release polymer to a first portion of a substrate in a desired pattern on only a part of the substrate;
   b) applying a substrate-adherent polymer over the pattern and over a least a second portion of the substrate in a continuous layer having a substantially constant height with respect to the substrate over the pattern and second substrate portion; and
   c) mechanically removing the substrate-adherent polymer from the pattern.

2. A method according to claim 1 wherein the release polymer has a surface energy less than that of the substrate-adherent polymer.

3. A method according to claim 1 wherein the release polymer comprises a fluoropolymer.

4. A method according to claim 1 wherein the substantially constant height is less than about 15 µm.

5. A method according to claim 1 wherein the substantially constant height is about 3 µm to about 5 µm.

6. A method according to claim 1 wherein the substantially constant height is less than about 3µm.

7. A method according to claim 1 wherein the release polymer pattern has a thickness and the substantially constant height is about 2 to about 10 times the release polymer pattern thickness.

8. A method according to claim 1 wherein the release polymer is applied using inkjet coating, die coating or screen coating.

9. A method according to claim 1 wherein the substrate-adherent polymer is applied using spin coating, dip coating, die coating or curtain coating.

10. A method according to claim 1 wherein the substrate-adherent polymer is removed from the pattern using impact media.

11. A method according to claim 1 wherein after the substrate-adherent polymer is removed from the pattern the pattern has at least one sidewall the major exposed portion of which is substantially perpendicular to the substrate.

12. A method according to claim 1 wherein the patterned article comprises a printed circuit board, electrical connector, information display or electronic component.

13. A method for preparing a patterned article comprising:
   a) applying a release polymer to a first portion of a substrate in a desired pattern on only a part of the substrate;
   b) applying a substrate-adherent polymer comprising a polymer over the pattern and over at least a second portion of the substrate in a continuous layer having a substantially constant height with respect to the substrate and second substrate portion; and
   c) mechanically removing the substrate-adherent polymer from the pattern.

14. A method for preparing a patterned article comprising:
   a) applying a release polymer to a first portion of a substrate in a desired pattern on only apart of the substrate;
   b) applying a continuous layer of a substrate-adherent polymer over the pattern and over at least a second portion of the substrate;
   c) applying an adhesive tape to the substrate-adherent polymer; and
   d) removing the adhesive tape and substrate-adherent polymer adhered to the tape atop the pattern while leaving a portion of the substrate-adherent polymer adhered to the substrate in a negative of the pattern.

15. A method according to claim 14 wherein the release polymer has a surface energy less than that of the substrate-adherent polymer.

16. A method according to claim 14 wherein the release polymer comprises a fluoropolymer.

17. A method according to claim 14 wherein the continuous layer has a substantially constant height with respect to the substrate over the pattern and second substrate portion.

18. A method according to claim 17 wherein the substantially constant height is less than about 15 µm.

19. A method according to claim 17 wherein the substantially constant height is about 3 µm to about 5µm.

20. A method according to claim 17 wherein the substantially constant height is less than about 3 µm.

21. A method according to claim 17 wherein the release polymer pattern has a thickness and the substantially constant height is about 2to about 10 times the release polymer pattern thickness.

22. A method according to claim 17 wherein after removing the tape the pattern has at least one sidewall the major exposed portion of which is substantially perpendicular to the substrate.

23. A method according to claim 14 wherein the patterned article comprises a printed circuit board, electrical connector, information display or electronic component.

24. A method for preparing a patterned article comprising:
   a) applying a submicron-thickness release polymer layer to a first portion of a substrate in a desired pattern on only a part of the substrate;
   b) applying a continuous submicron-thickness polyimide layer over the pattern and over at least a second portion of the substrate; and
   c) removing a portion of the polyimide layer from the release polymer while leaving the remainder of the polyimide layer adhered to the substrate in a negative of the pattern.

25. A method according to claim 24 wherein the release polymer comprises a fluoropolymer.

26. A method according to claim 24 wherein the thickness of the polyimide layer is about 2 to about 10 times the release polymer layer thickness.

27. A method according to claim 24 wherein after removing the polyimide layer from the release polymer the pattern has at least one sidewall the major exposed portion of which is substantially perpendicular to the substrate.

28. A method for preparing a patterned article comprising:
 a) applying a release polymer to a first portion of a substrate in a desired pattern on only a part of the substrate;
 b) applying a continuous layer of a substrate-adherent polymer comprising a polyimide over the pattern and over at least a second portion of the substrate;
 c) applying an adhesive tape to the substrate-adherent polymer; and
 d) removing the adhesive tape and substrate-adherent polymer adhered to the tape while leaving a portion of the substrate-adherent polymer adhered to the substrate in a negative of the pattern.

* * * * *

UNITED STATES PATENT AND TRADEMARK OFFICE
CERTIFICATE OF CORRECTION

PATENT NO. : 7,175,876 B2  Page 1 of 1
APPLICATION NO. : 10/607698
DATED : February 13, 2007
INVENTOR(S) : M. Benton Free It is certified that error appears in the above-identified patent and that said Letters Patent is hereby corrected as shown below:

Title Page,
Item (56) References Cited, OTHER PUBLICATIONS, Col. 2, Line 2, delete "Engery" and insert in place thereof -- Energy --.

Column 2,
Line 39, delete "e.g., about" and insert in place thereof -- e.g., at a thickness --.

Column 7,
Line 27, delete "over a least" and insert in place thereof -- over at least --.

Column 8,
Line 2, delete "polymer" and insert in place thereof -- polyimide --.
Line 10, delete "apart" and insert in place thereof -- a part --.
Line 39, delete "2to" and insert in place thereof -- 2 to --.

Signed and Sealed this

Fifteenth Day of April, 2008

JON W. DUDAS
*Director of the United States Patent and Trademark Office*